(12) United States Patent
Yuen

(10) Patent No.: US 10,992,109 B2
(45) Date of Patent: Apr. 27, 2021

(54) ELECTRICALLY ISOLATING VERTICAL-EMITTING DEVICES

(71) Applicant: Lumentum Operations LLC, Milpitas, CA (US)

(72) Inventor: Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/517,405

(22) Filed: Jul. 19, 2019

(65) Prior Publication Data

US 2020/0313401 A1    Oct. 1, 2020

Related U.S. Application Data

(60) Provisional application No. 62/827,545, filed on Apr. 1, 2019.

(51) Int. Cl.
| H01S 5/42 | (2006.01) |
| H01S 5/183 | (2006.01) |
| H01S 5/20 | (2006.01) |

(52) U.S. Cl.
CPC .......... *H01S 5/423* (2013.01); *H01S 5/18394* (2013.01); *H01S 5/1833* (2013.01); *H01S 5/18308* (2013.01); *H01S 5/2063* (2013.01)

(58) Field of Classification Search
CPC .... H01S 5/423; H01S 5/1833; H01S 5/18308; H01S 5/2063; H01S 5/18394; H01S 5/18311; H01S 5/02276; H01S 5/04256
See application file for complete search history.

(56) References Cited

U.S. PATENT DOCUMENTS

| 2005/0224946 A1* | 10/2005 | Dutta ........................ G02B 6/32 |
| | | 257/686 |
| 2019/0036308 A1* | 1/2019 | Carson .................. H01S 5/0014 |

* cited by examiner

*Primary Examiner* — Xinning (Tom) Niu
(74) *Attorney, Agent, or Firm* — Harrity & Harrity, LLP

(57) ABSTRACT

A device includes a substrate, a first vertical cavity surface emitting laser (VCSEL) array on the substrate, a second VCSEL array on the substrate and adjacent to the first VCSEL array, and an isolation structure between the first VCSEL array and the second VCSEL array. The isolation structure provides electrical isolation between the first VCSEL array and the second VCSEL array.

20 Claims, 8 Drawing Sheets

ELECTRICALLY ISOLATING VERTICAL-EMITTING DEVICES

RELATED APPLICATION(S)

This application claims priority under 35 U.S.C. § 119 to U.S. Provisional Application No. 62/827,545, filed on Apr. 1, 2019, and entitled "ELECTRICAL ISOLATION OF VERTICAL CAVITY SURFACE EMITTING LASER EMITTERS," the content of which is incorporated by reference herein in its entirety.

TECHNICAL FIELD

The present disclosure relates to electrical isolation of vertical-emitting devices and, more particularly, to use of an isolation structure to electrically isolate the vertical-emitting devices.

BACKGROUND

A vertical-emitting device, such as a vertical cavity surface emitting laser (VCSEL), may include a laser, an optical transmitter, and/or the like in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

According to some implementations, a device may include a substrate, a first vertical cavity surface emitting laser (VCSEL) array on the substrate, a second VCSEL array on the substrate and adjacent to the first VCSEL array, and an isolation structure between the first VCSEL array and the second VCSEL array. The isolation structure may provide electrical isolation between the first VCSEL array and the second VCSEL array.

According to some implementations, a device may include a substrate, a plurality of VCSELs on the substrate, a backside via, etched from a bottom side of the substrate, to electrically connect an anode to a VCSEL of the plurality of VCSELs, and an isolation structure. The isolation structure may provide electrical isolation for the VCSEL.

According to some implementations, a device may include a substrate, a first VCSEL array on the substrate, a second VCSEL array on the substrate and adjacent to the first VCSEL array, a backside via, etched from a bottom side of the substrate, to electrically connect a cathode of a first VCSEL of the first VCSEL array to an anode of a second VCSEL of the second VCSEL array, and an isolation structure between the first VCSEL array and the second VCSEL array. The isolation structure may provide electrical isolation between the first VCSEL and the second VCSEL.

DETAILED DESCRIPTION

The following detailed description of example implementations refers to the accompanying drawings. The same reference numbers in different drawings may identify the same or similar elements.

An emitter array (e.g., vertical cavity surface emitting laser (VCSEL) array) may include a plurality of vertical-emitting devices (e.g., VCSELs, lasers, optical transmitters, and/or the like). The plurality of emitter arrays and/or vertical-emitting devices may be electrically isolated from other emitter arrays and/or vertical-emitting devices, and/or regions of a substrate on which the emitter arrays and/or vertical-emitting devices are formed. However, in order to provide the electrical isolation, the emitter arrays and/or vertical-emitting devices may need to be grown on a semi-insulating substrate and/or provided with p-n-p-n isolation layers in an epitaxial structure. While this results in electrical isolation of emitter arrays and/or vertical-emitting devices, use of a semi-insulating substrate may reduce a reliability of the resulting emitter arrays and/or vertical-emitting devices. For example, a semi-insulating substrate may be associated with a higher quantity and/or likelihood of defects relative to other types of substrates. This reduces the quality and/or reliability of the resulting emitter arrays and/or vertical-emitting devices formed on the semi-insulating substrate.

Some implementations described herein provide various examples of VCSEL arrays that are electrically isolated by etching an isolation structure, such as a backside trench, from a bottom side of a substrate of a device. The isolation structure provides horizontal or lateral electrical isolation between adjacent VCSEL arrays by reducing and/or eliminating electrical conduction which may include metallization layers, epitaxial layers, the substrate, and/or the like between adjacent VCSEL arrays. In this way, the isolation structure permits the VCSEL arrays to be formed on an electrically conductive substrate (e.g., a doped substrate) and/or other types of substrates. This improves quality and/or reliability of the VCSEL arrays relative to VCSEL arrays formed on a semi-insulating substrate, permits VCSEL arrays to be electrically connected in series on the same substrate, and/or the like. For example, the electrically conductive substrate may include fewer defects and/or a lower likelihood of developing defects relative to a semi-insulating substrate. Moreover, this permits the electrodes of the VCSEL arrays to be moved from the top of the substrate to the bottom or backside of the substrate such that the device is permitted to be die attached onto a submount with electrical traces without using wirebonds, which reduces parasitic inductance of the assembly, reduces manufacturing complexity of the die attachment process, and/or the like.

Figure 1:
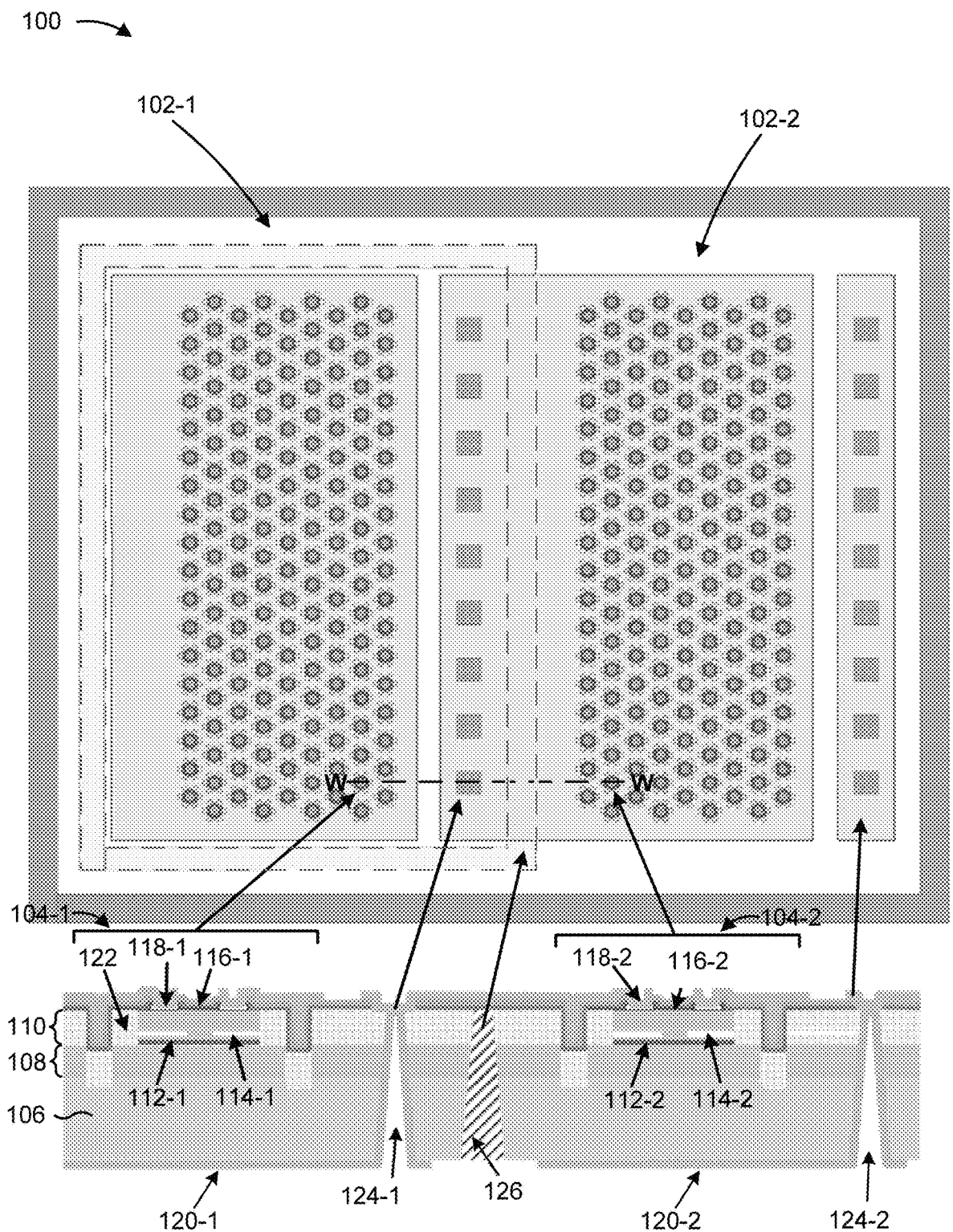
FIG. 1 illustrates a top-down view and a cross-sectional view of a device that includes a plurality of VCSEL arrays and an isolation structure.

FIG. 1 illustrates a top-down view, and a cross-sectional view along line WW, of an example device 100. Device 100 may include an optical device, an optical system, a VCSEL chip, and/or the like. Device 100 may include a plurality of VCSEL arrays 102, such as VCSEL array 102-1 and adjacent VCSEL array 102-2, and other VCSEL arrays. VCSEL arrays 102 may each include a plurality of VCSELs 104 or vertical-emitting devices, such as VCSEL 104-1, VCSEL 104-2, and/or other VCSELs. While FIG. 1 illustrates device 100 including particular quantities of VCSEL arrays, VCSELs, and/or other devices or components, in some implementations, device 100 may include greater and/or fewer quantities of VCSEL arrays, VCSELs, and/or other devices or components. Moreover, while some implementations are described herein with respect to VCSEL 104-1 or VCSEL 104-2, the implementations apply equally to both VCSEL 104-1 and VCSEL 104-2. In addition, while some implementations are described herein with respect to either VCSEL array 102-1 or VCSEL array 102-2, the implementations apply equally to both VCSEL array 102-1 and VCSEL array 102-2.

In some implementations, VCSELs 104 may be formed on a substrate 106 included in device 100. Substrate 106 may be formed of various semiconducting materials, such as III-V semiconductors (e.g., gallium arsenide (GaAs), indium gallium arsenide (InGaAs), indium phosphide (InP), and/or the like), IV semiconductors (e.g., silicon (Si) and/or the like), and/or the like. In some implementations, substrate 106 may be doped using various materials to form an n-type or p-type substrate, such as a p-doped GaAs or n-doped GaAs substrate, a p-doped InGaAs or n-doped InGaAs substrate, a p-doped InP or n-doped InP substrate, and/or the like.

As further shown in FIG. 1, VCSEL arrays 102 may include one or more n-doped epitaxial layers 108 formed on substrate 106. For example, the n-doped epitaxial layers 108 may include n-doped distributed Bragg reflector (n-DBR) layers and/or an N+ doped buffer layer. The n-DBR layers may include alternating layers of n-doped gallium arsenide (n-GaAs) and n-doped aluminum gallium arsenide (n-AlGaAs). The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems because the aluminum in the n-AlGaAs layer can oxidize and create a poor ohmic contact. As a result, some implementations may include an N+ doped buffer layer.

As further shown in FIG. 1, device 100 may include one or more p-doped epitaxial layers 110 formed on the n-doped epitaxial layers 108 (e.g., p-doped distributed Bragg reflector (p-DBR) layers). P-doped epitaxial layers 110 and n-doped epitaxial layers 108 may form the mirrors of a vertical cavity of VCSEL 104-1 and a vertical cavity of VCSEL 104-2.

As further shown in FIG. 1, active layers 112 may separate portions of p-doped epitaxial layers 110 and n-doped epitaxial layers 108. For example, active layer 112-1 may be a layer of VCSEL 104-1 where optical gain for VCSEL 104-1 is generated, and active layer 112-2 may be a layer of VCSEL 104-2 where optical gain for VCSEL 104-2 is generated. As further shown in FIG. 1, p-doped epitaxial layers 110 may include oxidation area 114, such as oxidation area 114-1 and oxidation area 114-2, to respectively resist electrical flow from a top anode 118-1 of VCSEL 104-1 (e.g., an anode that is located above the one or more epitaxial layers 108 and 110 on substrate 106) and a top anode 118-1 of VCSEL 104-2. Top anode 118-1 may be a source of electrical flow into VCSEL 104-1, and top anode 118-2 may be a source of electrical flow into VCSEL 104-2. Top anode 118-1 and top-anode 118-2 may contact the p-doped epitaxial layers 110. Moreover, oxidation areas 114 may guide the electrical flow through an oxidation aperture, through an active region of active layer 112-1 and 112-2, and toward n-doped epitaxial layer 108.

As further shown in FIG. 1, VCSEL 104-1 may include dielectric layer 116-1, and VCSEL 104-2 may include a dielectric layer 116-2. Dielectric layer 116-1 may include an aperture region where light is emitted from VCSEL 104-1, and dielectric layer 116-2 may include an aperture region where light is emitted from VCSEL 104-2. As further shown in FIG. 1, VCSEL 104-1 may include one or more regions of implant isolation material 122 to restrict electrical flow when VCSEL 104-1 and VCSEL 104-2 are powered. For example, implant isolation material 122 may be formed using an implantation technique. By using protons or ions, such as hydrogen ions, hydrogen protons, boron ions, oxygen ions, and/or the like, an implantation technique may damage or change an area of an epitaxial layer of VCSEL 104-1 and/or an epitaxial layer of VCSEL 104-2. The implantation technique may change or damage an area of the epitaxial layer so that the portion of the epitaxial layer is no longer electrically conductive (e.g., may form a highly electrically resistive area, a non-conductive area, a poorly conductive area. and/or the like).

As further shown in FIG. 1, VCSEL 104-1 may include a bottom cathode 120-1 (e.g., a cathode that is located on a backside or bottom side of substrate 106) and VCSEL 104-2 may include a bottom cathode 120-2. Bottom cathode 120-1 may include a metallized and/or conductive layer (e.g., solder metallization, gold plating, silver plating, copper plating, and/or the like) that serves as a point of egress for electrical flow from VCSEL 104-1, and bottom cathode 120-2 may include a metallized and/or conductive layer that serves as a point of egress for electrical flow from VCSEL 104-2.

As further shown in FIG. 1, device 100 may include a plurality of via arrays that each include a plurality of vias 124. Each via array may be associated with a connection from a plurality of VCSELs 104 included in a VCSEL array 102 to a plurality of VCSELS 104 in an adjacent VCSEL array 102. In some implementations, vias 124 may be backside or bottom side vias in that vias 124 may be etched into substrate 106 from a backside or bottom side of substrate 106. The metallization and/or conductive layer of bottom cathode 120-1 may be formed in via 124-1 (e.g., on the sidewalls of via 124-1) such that bottom cathode 120-1 electrically connects to top anode 118-2 of VCSEL 104-2 in via 124-1 and such that current flows from bottom cathode 120-1 to top anode 118-2. In this way, via 124-1 permits VCSEL 104-1 and VCSEL 104-2 to be electrically connected in series. Moreover, vias 124 permit other VCSELs of device 100 to be electrically connected in series, permit VCSEL array 102-1, VCSEL array 102-2, and/or other VCSEL arrays of device 100 to be electrically connected in series, and/or the like.

In some cases, the metallization of the sidewalls in vias 124, and the semiconducting or conducting nature of substrate 106, may cause shorting between electrodes of VCSELs and/or VCSEL arrays of device 100. For example, electrical current may horizontally or laterally traverse or flow from bottom cathode 120-1 in via 124-1 through substrate 106, epitaxial layer 108, epitaxial layer 110, and/or other layers of device 100 to bottom cathode 120-2. Accordingly, and as shown in FIG. 1, device 100 may include an isolation structure 126, between VCSEL array 102-1 and other VCSEL arrays 102 included in device 100, to provide horizontal or lateral electrical isolation between VCSELs 104 included in device 100, VCSEL arrays 102 included in device 100, and/or the like. Isolation structure 126 may include a backside or bottom side trench or via that is etched from the backside or bottom side of substrate 106 and through substrate 106, epitaxial layer 108, and at least partially into epitaxial layer 110, and/or other layers. Accordingly, isolation structure 126 is illustrated in dashed lines in the top-down view of FIG. 1 to indicate that isolation structure 126 is on the backside of device 100 and, thus, hidden in the top-down view. However, in other implementations, isolation structure 126 may include a topside trench that is etched through epitaxial layer 108, epitaxial layer 110, and at least partially into or fully through substrate 106 from a top side of substrate 106.

In some implementations, if isolation structure 126 includes a topside trench that is etched through epitaxial layer 108, epitaxial layer 110, and at least partially into substrate 106 from the top side of substrate 106, a remaining portion of substrate 106 between the bottom of the topside trench and the bottom side of substrate 106 may be processed to form an ion implant region or other non-conductive region to prevent lateral conduction in the remaining portion of substrate 106. In some implementations, if isolation structure 126 includes a topside trench that is etched through epitaxial layer 108, epitaxial layer 110, and fully through substrate 106 from the top side of substrate 106, a mechanical support structure may be included in one or more portions of the topside trench to prevent separation of VCSEL array 102-1 from VCSEL array 102-2. The mechanical support structure may include a zigzag region and/or another type of feature (sawtooth, stepped, castellated, and/or the like) in one or more portions of the topside trench.

In some implementations, isolation structure 126 may be an encircling trench that, as shown in the top-down view of FIG. 1, isolation structure 126 may fully encircle VCSEL array 102-1. Moreover, device 100 may include a plurality of isolation structures 126, and each isolation structure 126 may encircle a respective VCSEL array 102. In some implementations, isolation structure 126 may be at least partially or fully filled with various non-conductive materials, such as a polymer, a polyamide, a benzocyclobutene (BCB) polymer, and/or another type of dielectric material to increase electrical isolation and/or to provide mechanical support for device 100.

In this way, device 100 may include an isolation structure 126 that provides electrical isolation between VCSEL arrays 102 and/or VCSELs 104 included in device 100. Isolation structure 126 may reduce and/or eliminate electrical conduction between electrodes of VCSELs 104 and/or VCSEL arrays 102 by preventing electrical current from flowing between VCSELs 104 and/or VCSEL arrays 102 via substrate 106, epitaxial layer 108, epitaxial layer 110, and/or other layers. Moreover, isolation structure 126 permits the VCSEL arrays 102 to be formed on an electrically conductive substrate 106 (e.g., a doped substrate) and/or other types of substrates 106. This improves quality and/or reliability of the VCSEL arrays 102 relative to VCSEL arrays formed on a semi-insulating substrate, permits VCSEL arrays 102 to be electrically connected in series on the same substrate 106, and/or the like. For example, substrate 106 may include fewer defects and/or a lower likelihood of developing defects relative to a semi-insulating substrate.

As indicated above, FIG. 1 is provided merely as an example. Other examples are contemplated and may differ from what is described with regard to FIG. 1. For example, while FIG. 1 is described in connection with VCSEL arrays and VCSELs, the example implementations described in connection with FIG. 1 may include vertical-emitting light emitting diodes (LEDs) and/or other types of vertical-emitting devices, may include vertical-emitting LED arrays and/or other types of vertical-emitting device arrays, and/or the like.

Figure 2A:
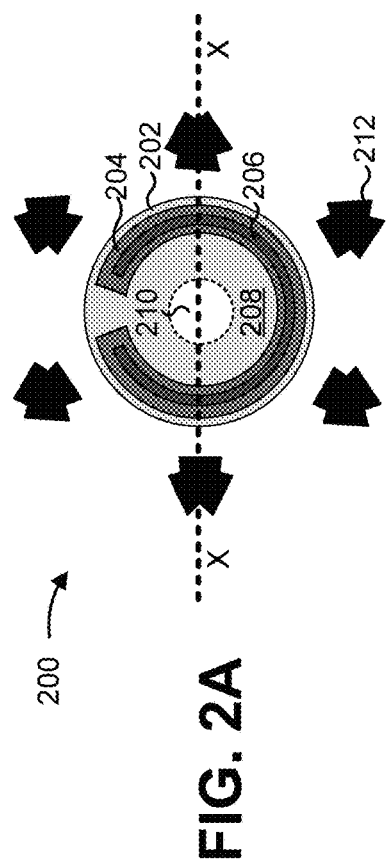
FIGS. 2A-2B are diagrams depicting a top-view of an example VCSEL and an example cross-sectional view of the example VCSEL, respectively.
Figure 2B:
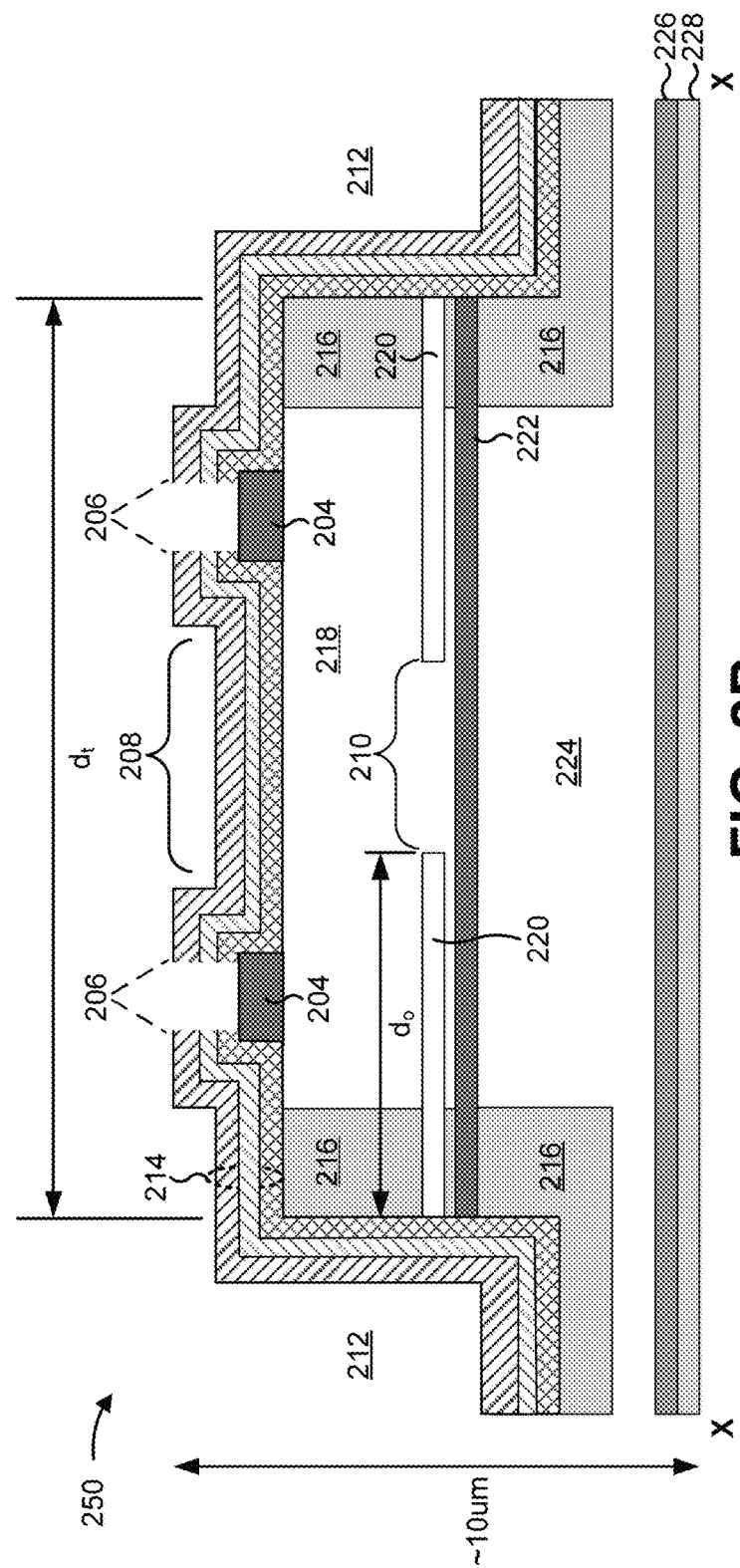

FIGS. 2A and 2B are diagrams depicting a top-view of a VCSEL 200 and an example cross-sectional view 250 of VCSEL 200, respectively. In some implementations, VCSEL 200 may be an example implementation of VCSELs 104 of FIG. 1 and/or other VCSELs or vertical-emitter devices described herein. As shown in FIG. 2A, VCSEL 200 may include a set of emitter layers constructed in an emitter architecture. For purposes of clarity, not all emitter layers of VCSEL 200 are shown in FIG. 2A. In some implementations, VCSEL 200 may correspond to one or more vertical-emitting devices described herein.

As shown in FIG. 2A, VCSEL 200 may include an implant protection layer 202 that is circular in shape in this example. In some implementations, implant protection layer 202 may have another shape, such as an elliptical shape, a polygonal shape, or the like. Implant protection layer 202 may be defined based on a space between sections of implant material included in VCSEL 200 (not shown). As shown by the medium gray area in FIG. 2A, VCSEL 200 may include a P-Ohmic metal layer 204 that may be constructed in a partial ring-shape (e.g., with an inner radius and an outer radius). As shown, P-Ohmic metal layer 204 may be positioned concentrically over implant protection layer 202 (e.g., the outer radius of P-Ohmic metal layer 204 may be less than or equal to the radius of implant protection layer 202). Such configuration may be used, for example, in the case of a P-up/top-emitting VCSEL 200. In the case of a bottom-emitting VCSEL 200, the configuration may be adjusted as needed.

As further shown in FIG. 2A, VCSEL 200 may include a dielectric via opening 206 that is formed (e.g., etched) on a dielectric passivation/mirror layer that covers P-Ohmic metal layer 204 (not shown). As shown, dielectric via opening 206 may be formed in a partial ring-shape (e.g., similar to P-Ohmic metal layer 204) and may be formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, VCSEL 200 may include an optical aperture 208 in a portion of the emitter within the inner radius of the partial ring-shape of P-Ohmic metal layer 204. VCSEL 200 may emit a laser beam via optical aperture 208. As further shown, VCSEL 200 may also include a current confinement aperture 210 (e.g., an oxide aperture formed by an oxidation layer of VCSEL 200 (not shown)). Current confinement aperture 210 may be formed below optical aperture 208.

As further shown in FIG. 2A, VCSEL 200 may include a set of oxidation trenches 212 that are spaced (e.g., equally, unequally) around a circumference of implant protection layer 202. How close oxidation trenches 212 can be positioned relative to the optical aperture 208 may be dependent on the application, and may be based on implant protection layer 202, P-Ohmic metal layer 204, dielectric via opening 206, and/or manufacturing tolerances.

The number and arrangement of layers shown in FIG. 2A are provided as an example. In practice, VCSEL 200 may include additional layers, fewer layers, different layers, or differently arranged layers than those shown in FIG. 2A. For example, while VCSEL 200 includes a set of six oxidation trenches 212, in practice, other designs are possible, such as a compact emitter that includes five oxidation trenches 212, seven oxidation trenches 212, and/or the like. As another example, while VCSEL 200 is a circular emitter design, in practice, other designs are possible, such as a rectangular emitter, a hexagonal emitter, an elliptical emitter, or the like. Additionally, or alternatively, a set of layers (e.g., one or more layers) of VCSEL 200 may perform one or more functions described as being performed by another set of layers of VCSEL 200, respectively.

Notably, while the design of VCSEL 200 is described as including a VCSEL, other implementations are possible. For example, the design of VCSEL 200 may apply in the context of another type of optical device, such as an LED, or another type of vertical emitting (e.g., top emitting or bottom emitting) optical device. Additionally, the design of VCSEL 200 may apply to emitters of any wavelength, power level, emission profile, or the like. In other words, VCSEL 200 is not particular to an emitter with a given performance characteristic.

As shown in FIG. 2B, the example cross-sectional view may represent a cross-section of VCSEL 200 that passes through a pair of oxidation trenches 212 (e.g., as shown by line XX in FIG. 2A). As shown, VCSEL 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, VCSEL 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, a conductive layer, and/or the like, such as an N-doped GaAs layer, an InP layer, and/or the like.

Bottom mirror 224 may include a bottom reflector layer of VCSEL 200. For example, bottom mirror 224 may include a DBR. Active region 222 may include a layer that confines electrons and defines an emission wavelength of VCSEL 200. For example, active region 222 may be a quantum well.

Oxidation layer 220 may include an oxide layer that provides optical and electrical confinement of VCSEL 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance (e.g., identified as $d_t$ in FIG. 2B) between oxidation trenches 212 that surround VCSEL 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of VCSEL 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of VCSEL 200. For example, top mirror 218 may include a DBR. Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202. Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of VCSEL 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 through which light may be emitted. P-Ohmic metal layer 204 may include a layer that makes electrical contact through which electrical current may flow. For example, P-Ohmic metal layer 204 may include a TiAu layer, a TiPtAu layer, or the like, through which electrical current may flow (e.g., by a bondpad (not shown) that contacts P-Ohmic metal layer 204 through dielectric via openings 206).

In some implementations, VCSEL 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B are provided as an example. In practice, VCSEL 200 may include additional layers, fewer layers, different layers, differently constructed layers, or differently arranged layers than those shown in FIG. 2B. Additionally, or alternatively, a set layers (e.g., one or more layers) of VCSEL 200 may perform one or more functions described as being performed by another set of layers of VCSEL 200.

Figure 3:
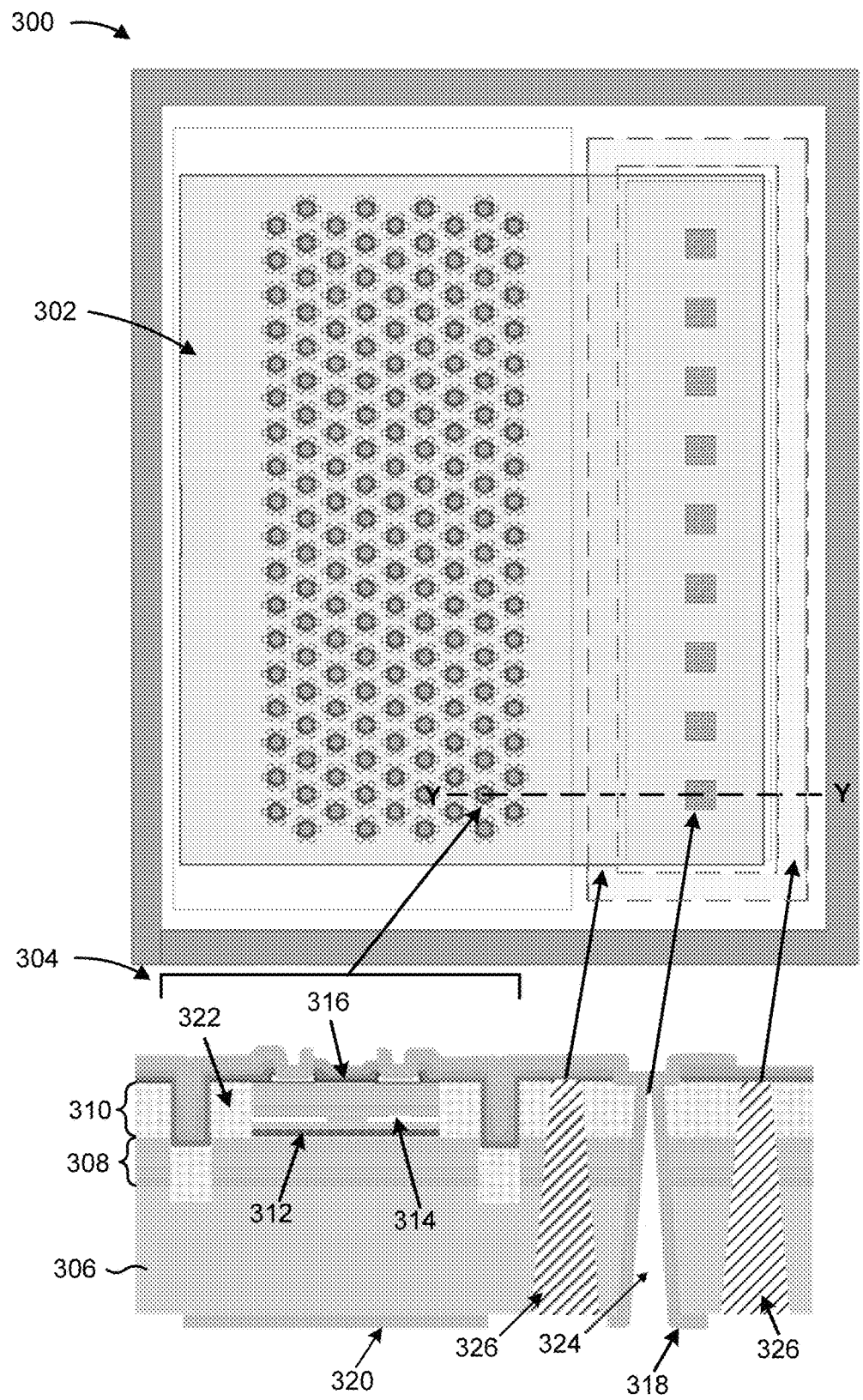
FIG. 3 illustrates a top-down view and a cross-sectional view of a device that includes a VCSEL array and an isolation structure.

FIG. 3 illustrates a top-down view, and a cross-sectional view along line YY, of an example device 300. Device 300 may include an optical device, an optical system, a VCSEL chip, and/or the like. Device 300 may include a VCSEL array 302. VCSEL array 302 may include a plurality of VCSELs 304 or vertical-emitting devices. While FIG. 3 illustrates device 300 including particular quantities of VCSELs and/or other devices or components, in some implementations, device 300 may include greater and/or fewer quantities of VCSELs and/or other devices or components.

In some implementations, VCSELs 304 may be formed on a substrate 306 included in device 300. Substrate 306 may be formed of various semiconducting materials, such as III-V semiconductors (e.g., GaAs, InGaAs, InP, and/or the like), IV semiconductors (e.g., Si and/or the like), and/or the like. In some implementations, substrate 306 may be doped using various materials to form an n-type or p-type substrate, such as a p-doped GaAs or n-doped GaAs substrate, a p-doped InGaAs or n-doped InGaAs substrate, a p-doped InP or n-doped InP substrate, and/or the like.

As further shown in FIG. 3, VCSEL array 302 may include one or more n-doped epitaxial layers 308 formed on substrate 306. For example, the n-doped epitaxial layers 308 may include n-DBR layers and/or an N+ doped buffer layer. The n-DBR layers may include alternating layers of n-GaAs and n-AlGaAs. The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems because the aluminum in the n-AlGaAs layer can oxidize and create a poor ohmic contact. As a result, some implementations may include an N+ doped buffer layer.

As further shown in FIG. 3, device 300 may include one or more p-doped epitaxial layers 310 formed on the n-doped epitaxial layers 308 (e.g., p-DBR layers). P-doped epitaxial layers 310 and n-doped epitaxial layers 308 may form the mirrors of a vertical cavity of VCSEL 304.

As further shown in FIG. 3, an active layer 312 may separate portions of p-doped epitaxial layers 310 and n-doped epitaxial layers 308. For example, active layer 312 may be a layer of VCSEL 304 where optical gain for VCSEL 304 is generated. As further shown in FIG. 3, p-doped epitaxial layers 310 may include oxidation area 314 to resist electrical flow from a bottom anode 318 of VCSEL 304 (e.g., an anode that is located on a bottom side or backside of substrate 306). Bottom anode 318 may be a source of electrical flow into VCSEL 304. Bottom anode 318 may contact the p-doped epitaxial layers 310. Moreover, oxidation areas 314 may guide the electrical flow through an oxidation aperture, through an active region of active layer 312 and toward n-doped epitaxial layer 308.

As further shown in FIG. 3, VCSEL 304 may include dielectric layer 316. Dielectric layer 316 may include an aperture region where light is emitted from VCSEL 304. As further shown in FIG. 3, VCSEL 304 may include one or more regions of implant isolation material 322 to restrict electrical flow when VCSEL 304 is powered. For example, implant isolation material 322 may be formed using an implantation technique. By using protons or ions, such as hydrogen ions, hydrogen protons, boron ions, oxygen ions, and/or the like, an implantation technique may damage or change an area of an epitaxial layer of VCSEL 304. The implantation technique may change or damage an area of the epitaxial layer so that the portion of the epitaxial layer is no longer electrically conductive (e.g., may form a highly electrically resistive area, a non-conductive area, a poorly conductive area. and/or the like).

As further shown in FIG. 3, VCSEL 304 may include a bottom cathode 320 (e.g., a cathode that is located on a backside or bottom side of substrate 306). Bottom cathode 320 may include a metallized and/or conductive layer (e.g., solder metallization, gold plating, silver plating, copper plating, and/or the like) that serves as a point of egress for electrical flow from VCSEL 304.

As further shown in FIG. 3, device 300 may include a via array, associated with VCSELs 304, that includes a plurality of vias 324. VCSEL 304 may be associated with a via 324. In some implementations, vias 324 may be backside or bottom side vias in that vias 324 may be etched into substrate 306 from a backside or bottom side of substrate 306. The metallization and/or conductive layer of bottom anode 318 may be formed in via 324 (e.g., on the sidewalls of via 324), such that via 324 permits bottom anode 318 to be moved from the top of VCSEL 304 and substrate 306 to the bottom or backside of the substrate 306. This permits device 300 to be die attached onto a submount with electrical traces without using wirebonds, which reduces parasitic inductance of the assembly, reduces manufacturing complexity of the die attachment process, and/or the like.

In some cases, the metallization of the sidewalls in vias 324, and the semiconducting or conducting nature of substrate 306, may cause shorting between bottom anode 318 and bottom cathode 320 of VCSEL 304 and/or VCSEL array 302 of device 300. For example, electrical current may horizontally or laterally traverse or flow from bottom cathode 320 through substrate 306, epitaxial layer 308, epitaxial layer 310, and/or other layers of device 300 to via 324, and thus to bottom anode 318. Accordingly, and as shown in FIG. 3, device 300 may include an isolation structure 326, between bottom cathode 320 and bottom anode 318, to provide horizontal or lateral electrical isolation between VCSELs 304 included in device 300. Isolation structure 326 may include a backside or bottom side trench or via that is etched from the backside or bottom side of substrate 306 and through substrate 306, epitaxial layer 308, and at least partially through epitaxial layer 310, and/or other layers. Accordingly, isolation structure 326 is illustrated in dashed lines in the top-down view of FIG. 3 to indicate that isolation structure 326 is on the backside of device 300 and, thus, hidden in the top-down view. However, in other implementations, isolation structure 326 may include a topside trench that is etched at least partially into or fully through epitaxial layer 308, epitaxial layer 310, and substrate 306 from a top side of substrate 306.

In some implementations, if isolation structure 326 includes a topside trench that is etched through epitaxial layer 308, epitaxial layer 310, and at least partially into substrate 306 from the top side of substrate 306, a remaining portion of substrate 306 between the bottom of the topside trench and the bottom side of substrate 306 may be processed to form an ion implant region or other non-conductive region to prevent lateral conduction in the remaining portion of substrate 306. In some implementations, if isolation structure 326 includes a topside trench that is etched through epitaxial layer 308, epitaxial layer 310, and fully through substrate 306 from the top side of substrate 306, a mechanical support structure may be included in one or more portions of the topside trench to prevent separation of the via array from VCSEL array 302 and/or other regions of device 300. The mechanical support structure may include a zigzag region and/or another type of feature (sawtooth, stepped, castellated, and/or the like) in one or more portions of the topside trench.

In some implementations, isolation structure 326 may be an encircling trench that, as shown in the top-down view of FIG. 3, may fully encircle the via array of VCSEL array 302. In some implementations, isolation structure 326 may be at least partially or fully filled with various non-conductive materials, such as a polymer, a polyamide, a BCB polymer, and/or another type of dielectric material to increase electrical isolation and/or to provide mechanical support for device 300.

In this way, device 300 may include an isolation structure 326 that provides electrical isolation between electrodes of VCSELs 304 in VCSEL arrays 302 included in device 300. Isolation structure 326 may reduce and/or eliminate electrical conduction between the electrodes by preventing electrical current from flowing between a bottom anode 318 and a bottom cathode 320 of VCSELs 304 and/or VCSEL array 302 via substrate 306, epitaxial layer 308, epitaxial layer 310, and/or other layers. Moreover, isolation structure 326 permits the VCSEL array 302 to be formed on an electrically conductive substrate 306 (e.g., a doped substrate) and/or other types of substrates 306. This improves quality and/or reliability of the VCSEL array 302 relative to VCSEL arrays formed on a semi-insulating substrate, and/or the like. Moreover, isolation structure 326 permits the use of vias 324 in device 300, which in turn permits bottom anode 318 to be moved from the top of VCSEL 304 and substrate 306 to the bottom or backside of the substrate 306, such that device 300 is permitted to be die attached onto a submount with electrical traces without using wirebonds, which reduces parasitic inductance of the assembly, reduces manufacturing complexity of the die attachment process, and/or the like.

As indicated above, FIG. 3 is provided merely as an example. Other examples are contemplated and may differ from what is described with regard to FIG. 3. For example, while FIG. 3 is described in connection with VCSEL arrays and VCSELs, the example implementations described in connection with FIG. 3 may include vertical-emitting LEDs and/or other types of vertical-emitting devices, may include vertical-emitting LED arrays and/or other types of vertical-emitting device arrays, and/or the like.

Figure 4:
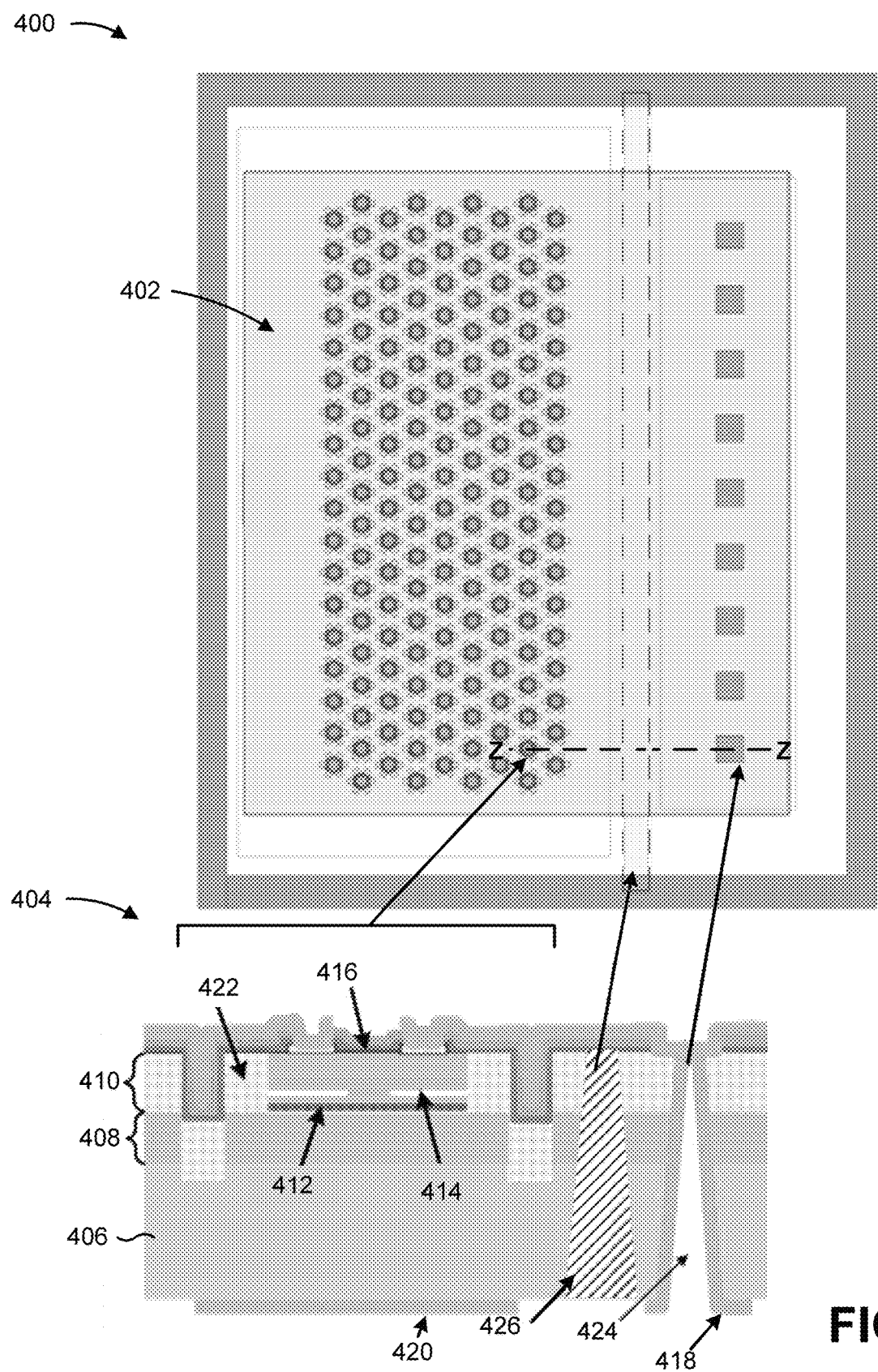
FIG. 4 illustrates a top-down view and a cross-sectional view of a device that includes a VCSEL array and an isolation structure.

FIG. 4 illustrates a top-down view, and a cross-sectional view along line ZZ, of an example device 400. Device 400 may include an optical device, an optical system, a VCSEL chip, and/or the like. Device 400 may include a VCSEL array 402. VCSEL array 402 may include a plurality of VCSELs 404 or vertical-emitting devices. While FIG. 4 illustrates device 400 including particular quantities of VCSELs and/or other devices or components, in some implementations, device 400 may include greater and/or fewer quantities of VCSELs and/or other devices or components.

In some implementations, VCSELs 404 may be formed on a substrate 406 included in device 400. Substrate 406 may be formed of various semiconducting materials, such as III-V semiconductors (e.g., GaAs, InGaAs, InP, and/or the like), IV semiconductors (e.g., Si and/or the like), and/or the like. In some implementations, substrate 306 may be doped using various materials to form an n-type or p-type substrate, such as a p-doped GaAs or n-doped GaAs substrate, a p-doped InGaAs or n-doped InGaAs substrate, a p-doped InP or n-doped InP substrate, and/or the like.

As further shown in FIG. 4, VCSEL array 402 may include one or more n-doped epitaxial layers 408 formed on substrate 406. For example, the n-doped epitaxial layers 408 may include n-DBR layers and/or an N+ doped buffer layer. The n-DBR layers may include alternating layers of n-GaAs and n-AlGaAs. The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems because the aluminum in the n-AlGaAs layer can oxidize and create a poor ohmic contact. As a result, some implementations may include an N+ doped buffer layer.

As further shown in FIG. 4, device 400 may include one or more p-doped epitaxial layers 410 formed on the n-doped epitaxial layers 408 (e.g., p-DBR layers). P-doped epitaxial layers 410 and n-doped epitaxial layers 408 may form the mirrors of a vertical cavity of VCSEL 404.

As further shown in FIG. 4, an active layer 412 may separate portions of p-doped epitaxial layers 410 and n-doped epitaxial layers 408. For example, active layer 412 may be a layer of VCSEL 404 where optical gain for VCSEL 304 is generated. As further shown in FIG. 4, p-doped epitaxial layers 410 may include oxidation area 414 to resist electrical flow from a bottom anode 418 of VCSEL 404 (e.g., an anode that is located on a bottom side or backside of substrate 406). Bottom anode 418 may be a source of electrical flow into VCSEL 404. Bottom anode 418 may contact the p-doped epitaxial layers 410. Moreover, oxidation areas 414 may guide the electrical flow through an oxidation aperture, through an active region of active layer 412 and toward n-doped epitaxial layer 408.

As further shown in FIG. 4, VCSEL 404 may include dielectric layer 416. Dielectric layer 416 may include an aperture region where light is emitted from VCSEL 404. As further shown in FIG. 4, VCSEL 404 may include one or more regions of implant isolation material 422 to restrict electrical flow when VCSEL 404 is powered. For example, implant isolation material 422 may be formed using an implantation technique. By using protons or ions, such as hydrogen ions, hydrogen protons, boron ions, oxygen ions, and/or the like, an implantation technique may damage or change an area of an epitaxial layer of VCSEL 404. The implantation technique may change or damage an area of the epitaxial layer so that the portion of the epitaxial layer is no longer electrically conductive (e.g., may form a highly electrically resistive area, a non-conductive area, a poorly conductive area. and/or the like).

As further shown in FIG. 4, VCSEL 404 may include a bottom cathode 420 (e.g., a cathode that is located on a backside or bottom side of substrate 406). Bottom cathode 420 may include a metallized and/or conductive layer (e.g., solder metallization, gold plating, silver plating, copper plating, and/or the like) that serves as a point of egress for electrical flow from VCSEL 404.

As further shown in FIG. 4, device 400 may include a via array, associated with VCSELs 404, that includes a plurality of vias 424. VCSEL 404 may be associated with a via 424. In some implementations, vias 424 may be backside or bottom side vias in that vias 424 may be etched into substrate 406 from a backside or bottom side of substrate 406. The metallization and/or conductive layer of bottom anode 418 may be formed in via 424 (e.g., on the sidewalls of via 424) such that via 424 permits bottom anode 418 to be moved from the top of VCSEL 404 and substrate 406 to the bottom or backside of the substrate 406 such that device 400 is permitted to be die attached onto a submount with electrical traces without using wirebonds, which reduces parasitic inductance of the assembly, reduces manufacturing complexity of the die attachment process, and/or the like.

In some cases, the metallization of the sidewalls in vias 424, and the semiconducting or conducting nature of substrate 406, may cause shorting between bottom anode 418 and bottom cathode 420 of VCSEL 404 and/or VCSEL array 402 of device 400. For example, electrical current may horizontally or laterally traverse or flow from bottom cathode 420 through substrate 406, epitaxial layer 408, epitaxial layer 410, and/or other layers of device 400 to via 424, and thus to bottom anode 418. Accordingly, and as shown in FIG. 4, device 400 may include an isolation structure 426, between bottom cathode 420 and bottom anode 418, to provide horizontal or lateral electrical isolation between VCSELs 404 included in device 400. Isolation structure 426 may include a backside or bottom side trench or via that is etched from the backside or bottom side of substrate 406 and through substrate 406, epitaxial layer 408, and at least partially into epitaxial layer 410, and/or other layers. Accordingly, isolation structure 426 is illustrated in dashed lines in the top-down view of FIG. 4 to indicate that isolation structure 426 is on the backside of device 400 and, thus, hidden in the top-down view. However, in other implementations, isolation structure 426 may include a topside trench that is etched at least partially into or fully through epitaxial layer 408, epitaxial layer 410, and substrate 406 from a top side of substrate 406.

In some implementations, if isolation structure 426 includes a topside trench that is etched through epitaxial layer 408, epitaxial layer 410, and at least partially into substrate 406 from the top side of substrate 406, a remaining portion of substrate 406 between the bottom of the topside trench and the bottom side of substrate 406 may be processed to form an ion implant region or other non-conductive region to prevent lateral conduction in the remaining portion of substrate 406. In some implementations, if isolation structure 426 includes a topside trench that is etched through epitaxial layer 408, epitaxial layer 410, and fully through substrate 406 from the top side of substrate 106, a mechanical support structure may be included in one or more portions of the topside trench to prevent separation of VCSEL array 402 from other regions of device 400. The mechanical support structure may include a zigzag region and/or another type of feature (sawtooth, stepped, castellated, and/or the like) in one or more portions of the topside trench.

In some implementations, isolation structure 426 may be a trench that, as shown in the top-down view of FIG. 4, extends from one side or edge of VCSEL array 402 and device 400 to another side or edge of VCSEL array 402 and device 400 between VCSELs 404 and the via array. The electrical isolation provided by isolation structure 426 may be completed or formed when the wafer on which device 400 is fabricated is diced into individual chips, with the dicing (e.g., by dicing, sawing, scribing and breaking, and/or the like) completing the electrical isolation between of isolation structure 426. In this way, the amount of substrate and/or epitaxial layer material that is removed to form isolation structure 426 is reduced, which provides mechanical support of isolation structure 426 during the fabrication process. In some implementations, isolation structure 426 may be at least partially or fully filled with various non-conductive materials, such as a polymer, a polyamide, a BCB polymer, and/or another type of dielectric material to increase electrical isolation and/or to provide mechanical support for device 400.

In this way, device 400 may include an isolation structure 426 that provides electrical isolation between electrodes of VCSELs 404 in a VCSEL arrays 402 included in device 400. Isolation structure 426 may reduce and/or eliminate electrical conduction between the electrodes by preventing electrical current from flowing between a bottom anode 418 and a bottom cathode 420 of VCSELs 404 and/or VCSEL array 402 via substrate 406, epitaxial layer 408, epitaxial layer 410, and/or other layers. Moreover, isolation structure 426 permits the VCSEL array 402 to be formed on an electrically conductive substrate 406 (e.g., a doped substrate) and/or other types of substrates 406. This improves quality and/or reliability of the VCSEL array 402 relative to VCSEL arrays formed on a semi-insulating substrate, and/or the like. Moreover, isolation structure 426 permits the use of vias 424 in device 400, which in turn permits bottom anode 418 to be moved from the top of VCSEL 404 and substrate 406 to the bottom or backside of the substrate 406, such that device 400 is permitted to be die attached onto a submount with electrical traces without using wirebonds, which reduces parasitic inductance of the assembly, reduces manufacturing complexity of the die attachment process, and/or the like.

As indicated above, FIG. 4 is provided merely as an example. Other examples are contemplated and may differ from what is described with regard to FIG. 4. For example, while FIG. 4 is described in connection with VCSEL arrays and VCSELs, the example implementations described in connection with FIG. 4 may include vertical-emitting LEDs and/or other types of vertical-emitting devices, may include vertical-emitting LED arrays and/or other types of vertical-emitting device arrays, and/or the like.

Figure 5:
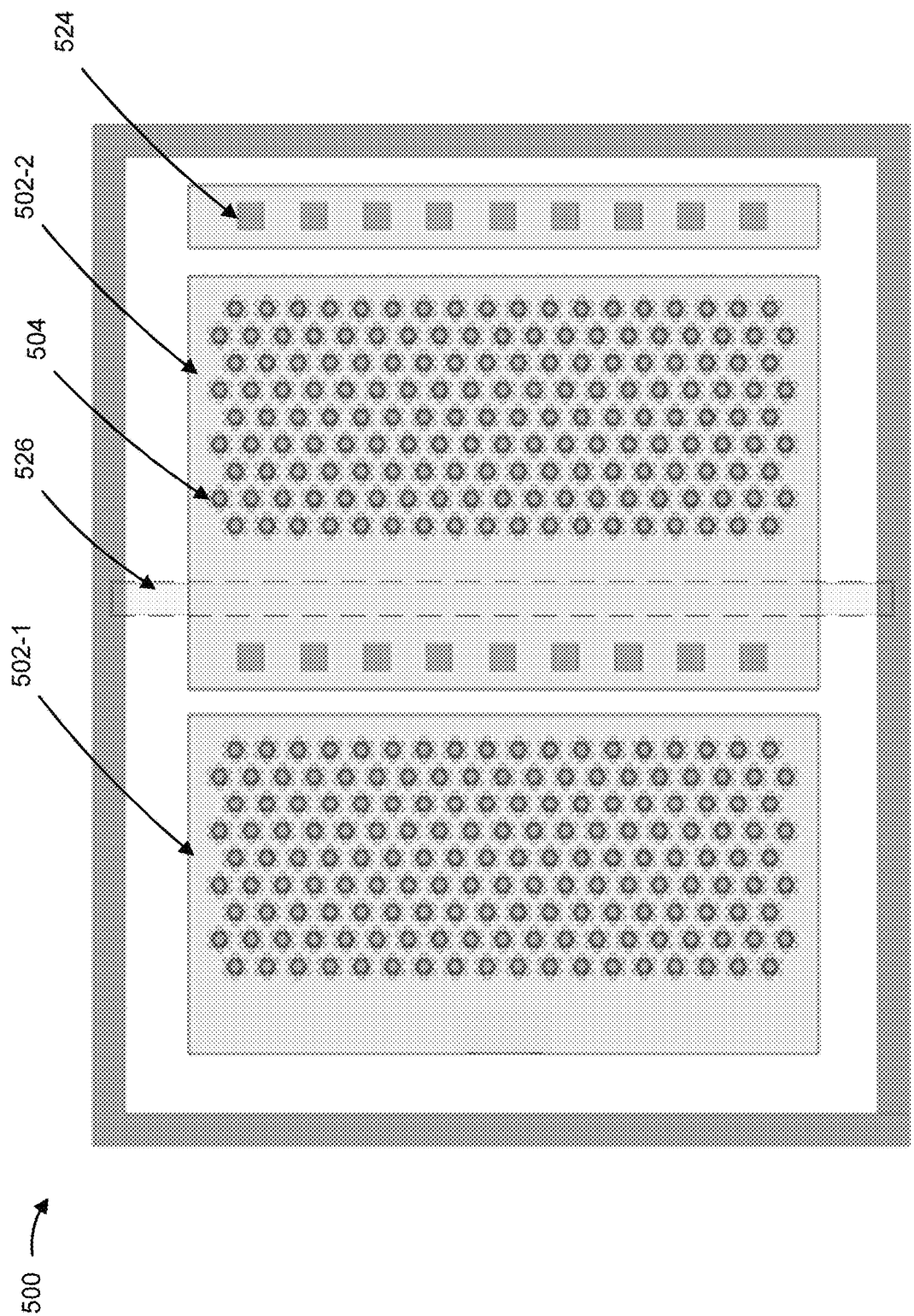
FIG. 5 illustrates a top-down view of a device that includes a plurality of VCSEL arrays and an isolation structure.

FIG. 5 illustrates a top-down view of an example device 500. Device 500 may include an optical device, an optical system, a VCSEL chip, and/or the like. Device 500 may include a plurality of VCSEL arrays 502, such as VCSEL array 502-1 and adjacent VCSEL array 502-2, and other VCSEL arrays. VCSEL arrays 502 may each include a plurality of VCSELs 504 or vertical-emitting devices. While FIG. 5 illustrates device 500 including particular quantities of VCSEL arrays, VCSELs, and/or other devices or components, in some implementations, device 500 may include greater and/or fewer quantities of VCSEL arrays, VCSELs, and/or other devices or components.

In some implementations, device 500 may be similar to device 100 described above in connection with FIG. 1, and components, materials, and/or the like may be similar to those described above in connection with FIG. 1. For example, VCSEL array 502-1, VCSEL array 502-2, and VCSELs 504 may respectively be similar to VCSEL array 102-1, VCSEL array 102-2, and VCSELs 104 of device 100. Moreover, device 500 may include a plurality of via arrays that each include a plurality of vias 524 that may be similar to vias 124 of device 100.

As further shown in FIG. 5, device 500 may include an isolation structure 526 that provides horizontal or lateral electrical isolation between VCSEL arrays 502 and/or VCSELs 504 of device 500. For example, isolation structure 526 may provide horizontal or lateral electrical isolation between VCSEL array 502-1 and VCSEL array 502-2, between VCSELs 504 included in VCSEL array 502-1 and VCSEL array 502-2, and/or the like.

Isolation structure 526 may include a backside or bottom side trench or via that is etched from the backside or bottom side of a substrate of device 500 (not shown), through the substrate, and at least partially into and/or fully through one or more epitaxial layers of device 500 (not shown), and/or other layers. Accordingly, isolation structure 526 is illustrated in dashed lines in the top-down view of FIG. 5 to indicate that isolation structure 526 is on the backside of device 500 and, thus, hidden in the top-down view. However, in other implementations, isolation structure 526 may include a topside trench that is etched through the one or more epitaxial layers and at least partially into or fully through the substrate from a top side of the substrate.

In some implementations, if isolation structure 526 includes a topside trench that is etched through the one or more epitaxial layers and at least partially into the substrate from a top side of the substrate, a remaining portion of the substrate between the bottom of the topside trench and the bottom side of the substrate may be processed to form an ion implant region or other non-conductive region to prevent lateral conduction in the remaining portion of the substrate. In some implementations, if isolation structure 526 includes a topside trench that is etched through the one or more epitaxial layers and at least partially into the substrate from a top side of the substrate, a mechanical support structure may be included in one or more portions of the topside trench to prevent separation of VCSEL array 502-1 from VCSEL array 502-2. The mechanical support structure may include a zigzag region and/or another type of feature (sawtooth, stepped, castellated, and/or the like) in one or more portions of the topside trench.

In some implementations, isolation structure 526 may be a trench that, as shown in FIG. 5, is located between VCSEL array 502-1 and VCSEL array 502-2 and extends from one common side or edge of VCSEL array 502-1 and VCSEL array 502-2, and device 500 to another common side or edge of VCSEL array 502-1 and VCSEL array 502-2, and device 500. Moreover, device 500 may include a plurality of isolation structures 526, and each isolation structure 526 may provide electrical isolation between two or more VCSEL arrays 502.

The electrical isolation provided by isolation structure 526 may be completed or formed when the wafer on which device 500 is fabricated is diced into individual chips, with the dicing (e.g., by dicing, sawing, scribing and breaking, and/or the like) completing the electrical isolation of isolation structure 526. In this way, the amount of substrate and/or epitaxial layer material that is removed to form isolation structure 526 is reduced, which provides mechanical support of isolation structure 526 during the fabrication process. In some implementations, isolation structure 526 may be at least partially or fully filled with various non-conductive materials, such as a polymer, a polyamide, a BCB polymer, and/or another type of dielectric material to increase electrical isolation and/or to provide mechanical support for device 500.

In this way, device 500 may include an isolation structure 526 that provides electrical isolation between VCSEL arrays 502 and/or VCSELs 504 included in device 500. Isolation structure 526 may reduce and/or eliminate electrical conduction between electrodes of VCSELs 504 and/or VCSEL arrays 502 by preventing electrical current from flowing between VCSELs 504 and/or VCSEL arrays 502 via a substrate, one or more epitaxial layers, and/or other layers. Moreover, isolation structure 526 permits the VCSEL arrays 502 to be formed on an electrically conductive substrate (e.g., a doped substrate) and/or other types of substrates. This improves quality and/or reliability of the VCSEL arrays 502 relative to VCSEL arrays formed on a semi-insulating substrate, permits VCSEL arrays 502 to be electrically connected in series on the same substrate, and/or the like.

For example, the substrate may include fewer defects and/or a lower likelihood of developing defects relative to a semi-insulating substrate.

As indicated above, FIG. 5 is provided merely as an example. Other examples are contemplated and may differ from what is described with regard to FIG. 5. For example, while FIG. 5 is described in connection with VCSEL arrays and VCSELs, the example implementations described in connection with FIG. 5 may include vertical-emitting LEDs and/or other types of vertical-emitting devices, may include vertical-emitting LED arrays and/or other types of vertical-emitting device arrays, and/or the like.

Figure 6:
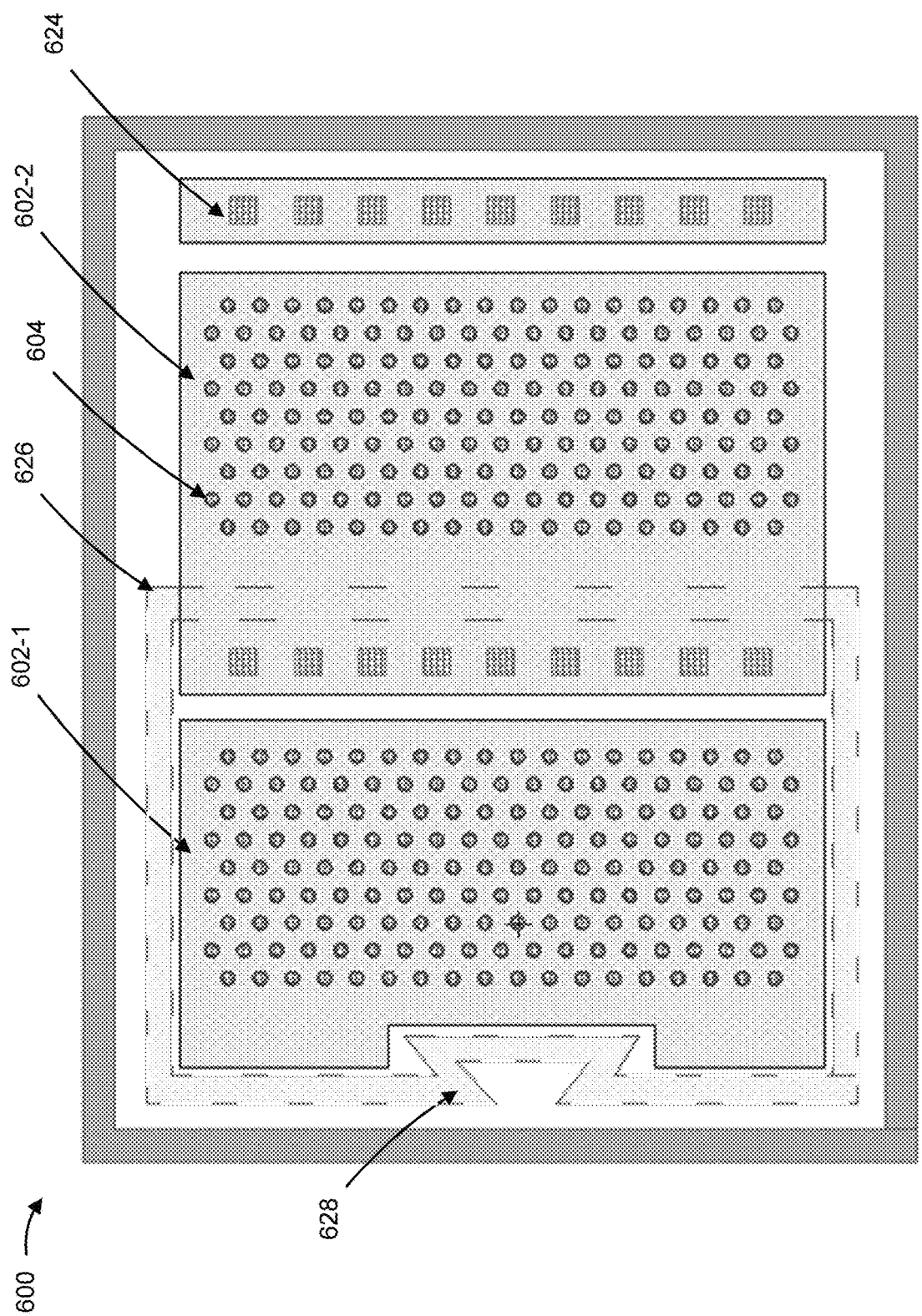
FIG. 6 illustrates a top-down view of a device that includes a plurality of VCSEL arrays and an isolation structure.

FIG. 6 illustrates a top-down view of an example device 600. Device 600 may include an optical device, an optical system, a VCSEL chip, and/or the like. Device 600 may include a plurality of VCSEL arrays 602, such as VCSEL array 602-1 and adjacent VCSEL array 602-2, and other VCSEL arrays. VCSEL arrays 602 may each include a plurality of VCSELs 604 or vertical-emitting devices. While FIG. 6 illustrates device 600 including particular quantities of VCSEL arrays, VCSELs, and/or other devices or components, in some implementations, device 500 may include greater and/or fewer quantities of VCSEL arrays, VCSELs, and/or other devices or components.

In some implementations, device 600 may be similar to device 100 described above in connection with FIG. 1, and components, materials, and/or the like may be similar to those described above in connection with FIG. 1. For example, VCSEL array 602-1, VCSEL array 602-2, and VCSELs 604 may respectively be similar to VCSEL array 102-1, VCSEL array 102-2, and VCSELs 104 of device 100. Moreover, device 600 may include a plurality of via arrays that each include a plurality of vias 624 that may be similar to vias 124 of device 100.

As further shown in FIG. 6, device 600 may include an isolation structure 626 that provides horizontal or lateral electrical isolation between VCSEL arrays 602 and/or VCSELs 604 of device 600. For example, isolation structure 626 may provide horizontal or lateral electrical isolation between VCSEL array 602-1 and VCSEL array 602-2, between VCSELs 604 included in VCSEL array 602-1 and VCSEL array 602-2, and/or the like.

Isolation structure 626 may include a backside or bottom side trench or via that is etched from the backside or bottom side of a substrate (not shown) of device 600, through the substrate, at least partially into and/or fully through one or more epitaxial layers (not shown) of device 600, and/or other layers. Accordingly, isolation structure 626 is illustrated in dashed lines in the top-down view of FIG. 6 to indicate that isolation structure 626 is on the backside of device 600 and, thus, hidden in the top-down view. However, in other implementations, isolation structure 626 may include a topside trench that is etched through the one or more epitaxial layers and at least partially into and/or fully through the substrate from a top side of the substrate.

In some implementations, if isolation structure 626 includes a topside trench that is etched through the one or more epitaxial layers and at least partially into the substrate from a top side of the substrate, a remaining portion of the substrate between the bottom of the topside trench and the bottom side of the substrate may be processed to form an ion implant region or other non-conductive region to prevent lateral conduction in the remaining portion of the substrate. In some implementations, if isolation structure 626 includes a topside trench that is etched through the one or more epitaxial layers and at least partially into the substrate from a top side of the substrate, a mechanical support structure may be included in one or more portions of the topside trench to prevent separation of VCSEL array 602-1 from VCSEL array 602-2. The mechanical support structure may include a zigzag region and/or another type of feature (sawtooth, stepped, castellated, and/or the like) in one or more portions of the topside trench.

In some implementations, isolation structure 626 may be an encircling trench that, as shown in FIG. 6, at least partially or fully encircles VCSEL array 602-1 and the corresponding via array. Moreover, device 600 may include a plurality of isolation structures 626, and each isolation structure 626 may encircle a respective VCSEL array 602.

In some implementations, isolation structure 626 may include a mechanical support structure 628 to provide additional mechanical support for device 600 and/or VCSEL array 602-1. Mechanical support structure 628 may include a zigzag region and/or another type of feature (sawtooth, stepped, castellated, and/or the like) in one or more portions of the trench of isolation structure 626. For example, and as shown in FIG. 6, mechanical support structure 628 may be included on one side or edge of VCSEL array 602-1. As another example, isolation structure 626 may include a plurality of mechanical support structures 628, wherein each mechanical support structure 628 is included on a different side or edge of VCSEL array 602-1, a plurality of mechanical support structures 628 may be included on a single side or edge of VCSEL array 602-1, and/or the like to provide mechanical support around the VCSEL array 602-1.

In some implementations, isolation structure 626 may be at least partially or fully filled with various non-conductive materials, such as a polymer, a polyamide, a BCB polymer, and/or another type of dielectric material to increase electrical isolation and/or to provide mechanical support for device 600.

In this way, device 600 may include an isolation structure 626 that provides electrical isolation between VCSEL arrays 602 and/or VCSELs 604 included in device 600. Isolation structure 626 may reduce and/or eliminate electrical conduction between electrodes of VCSELs 104 and/or VCSEL arrays 602 by preventing electrical current from flowing between VCSELs 604 and/or VCSEL arrays 602 via a substrate, one or more epitaxial layers, and/or other layers. Moreover, isolation structure 626 permits the VCSEL arrays 602 to be formed on an electrically conductive substrate (e.g., a doped substrate) and/or other types of substrates. This improves quality and/or reliability of the VCSEL arrays 602 relative to VCSEL arrays formed on a semi-insulating substrate, permits VCSEL arrays 602 to be electrically connected in series on the same substrate, and/or the like. For example, the substrate may include fewer defects and/or a lower likelihood of developing defects relative to a semi-insulating substrate.

As indicated above, FIG. 6 is provided merely as an example. Other examples are contemplated and may differ from what is described with regard to FIG. 6. For example, while FIG. 6 is described in connection with VCSEL arrays and VCSELs, the example implementations described in connection with FIG. 6 may include vertical-emitting LEDs and/or other types of vertical-emitting devices, may include vertical-emitting LED arrays and/or other types of vertical-emitting device arrays, and/or the like.

Figure 7:
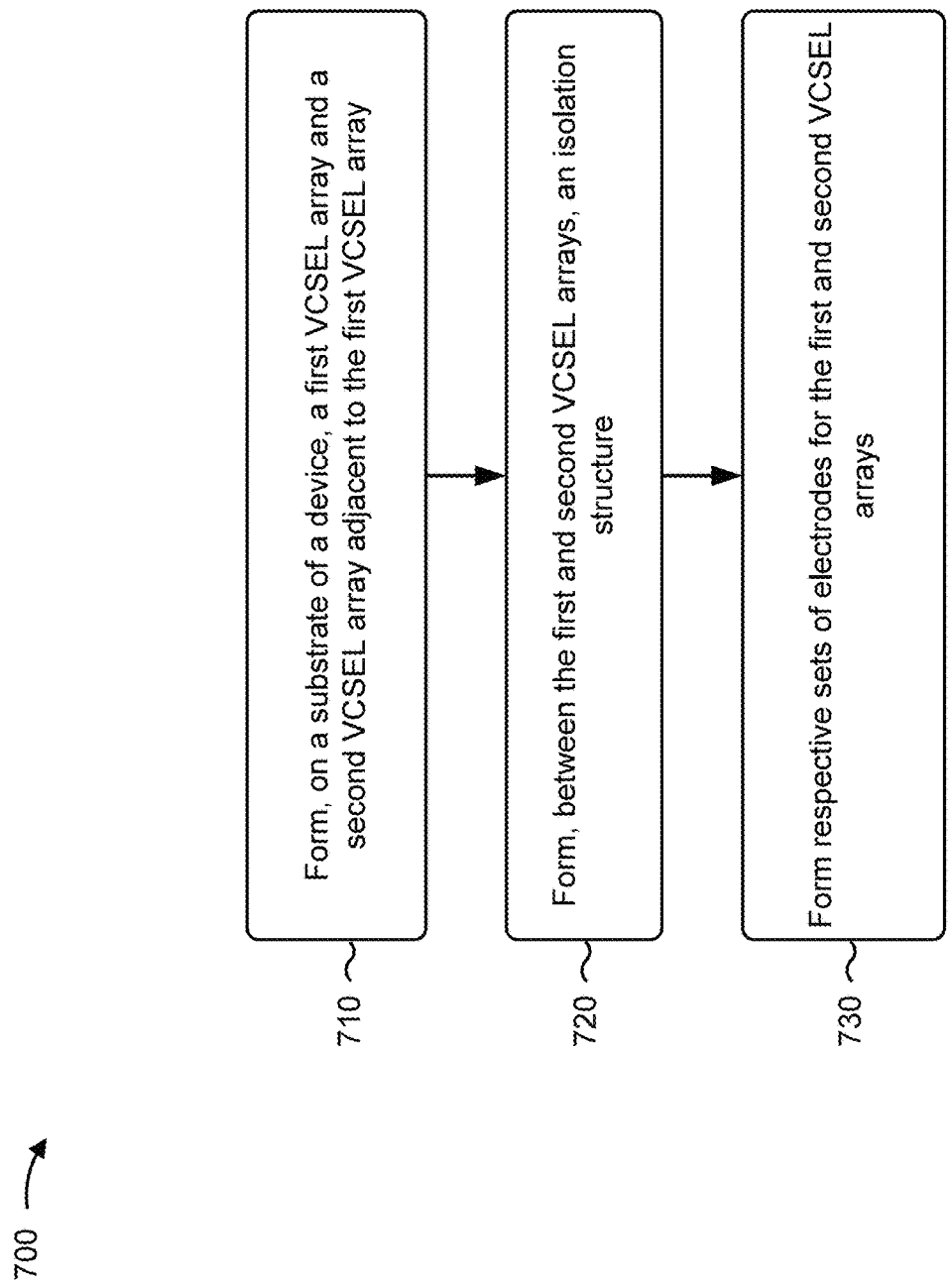
FIG. 7 is a flow chart of an example process for electrically isolating VCSEL arrays.

FIG. 7 is a flow chart of an example process 700 for electrically isolating VCSEL arrays. For example, FIG. 7 shows an example process for electrically isolating adjacent VCSEL arrays (e.g., adjacent VCSEL arrays 102, adjacent VCSEL arrays 502, adjacent VCSEL arrays 602, and/or the like) using an isolation structure (e.g., isolation structure 126, isolation structure 526, isolation structure 626, and/or the like).

As shown in FIG. 7, process 700 may include forming, on a substrate of a device, a first VCSEL array and a second VCSEL array adjacent to the first VCSEL array (block 710). For example, process 700 may include forming, on a substrate (e.g., substrate 106, and/or the like) of a device (e.g., device 100, device 500, device 600, and/or the like), a first VCSEL array (e.g., VCSEL array 102-1, VCSEL array 502-1, VCSEL array 602-1, and/or the like) and a second VCSEL array (e.g., VCSEL array 102-2, VCSEL array 502-2, VCSEL array 602-2, and/or the like) adjacent to the first VCSEL array, as described above. In some implementations, the substrate may include a GaAs substrate, an InGaAs substrate, an InP substrate, and/or the like that has been n or p doped. Additionally, or alternatively, the substrate may be electrically conductive, may be semi-conductive, may have low electrical resistivity, and/or the like. In some implementations, the first and second VCSEL arrays may respectively include arrays of VCSELs (e.g., VCSELs 104, VCSELs 504, VCSELs 604, and/or the like), vertical LEDs, vertical-emitting lasers, and/or other types of vertical light emitting devices. In some implementations, one or more doped epitaxial layers (e.g., p-doped epitaxial layers 110 and/or n-doped epitaxial layers 108) may be formed on the substrate. In some implementations, sets of epitaxial layers may be formed on the substrate to form the first and second VCSEL arrays.

As further shown in FIG. 7, process 700 may include forming, between the first and second VCSEL arrays, an isolation structure (block 720). For example, process 700 may include forming, between the first and second VCSEL arrays, an isolation structure (e.g., isolation structure 126, isolation structure 526, isolation structure 626, and/or the like), as described above. In some implementations, the isolation structure may include a trench that at least partially or fully encircles the first VCSEL array. In some implementations, the isolation structure may include a trench that extends from one side of the device to another side of the device.

In some implementations, forming the isolation structure may include etching from a backside or bottom side of the substrate, through the substrate, and through the one or more epitaxial layers to provide horizontal or lateral electrical isolation between the first and second VCSEL arrays. In some implementations, forming the isolation structure may include etching through the one or more epitaxial layers and at least partially into or fully through the substrate from a top side of the substrate to provide horizontal or lateral electrical isolation between the electrodes (e.g., the bottom cathode and the bottom anode) of the VCSEL array. In some implementations, if the isolation structure includes a topside trench that is etched through the one or more epitaxial layers and at least partially into the substrate from a top side of the substrate, a remaining portion of the substrate between the bottom of the topside trench and the bottom side of the substrate may be processed to form an ion implant region or other non-conductive region to prevent lateral conduction in the remaining portion of the substrate. In some implementations, if the isolation structure includes a topside trench that is etched through the one or more epitaxial layers and at least partially into the substrate from a top side of the substrate, a mechanical support structure may be included in one or more portions of the topside trench to prevent separation between VCSEL arrays and/or other regions of the device. The mechanical support structure may include a zigzag region and/or another type of feature (sawtooth, stepped, castellated, and/or the like) in one or more portions of the topside trench.

In some implementations, forming the isolation structure may include at least partially or fully filling the isolation structure with various non-conductive materials, such as a polymer, a polyamide, a BCB polymer, and/or another type of dielectric material to increase electrical isolation and/or to provide mechanical support for the device. In some implementations, the isolation structure may include a mechanical support structure (e.g., mechanical support structure 628) to provide increased mechanical support for the device.

As further shown in FIG. 7, process 700 may include forming respective sets of electrodes for the first and second VCSEL arrays (block 730). For example, process 700 may include forming a top anode (e.g., top anode 118) and a bottom cathode (e.g., bottom cathode 120) for each of the first and the second VCSEL arrays. In some implementations, forming the respective sets of electrodes may include forming a backside or bottom side via in the substrate and one or more epitaxial layers, so that a bottom cathode of the first VCSEL array and the top anode of the second VCSEL may be electrically connected, such that the first and second VCSEL arrays may be electrical connected in series. In some implementations, forming the respective sets of electrodes may include depositing a metallization layer or conductive plating on the backside or bottom side of the substrate and on the sidewalls of the via for the bottom cathode, and depositing a metallization layer or conductive plating on the top of the substrate or the one or more epitaxial layers for the top anode.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
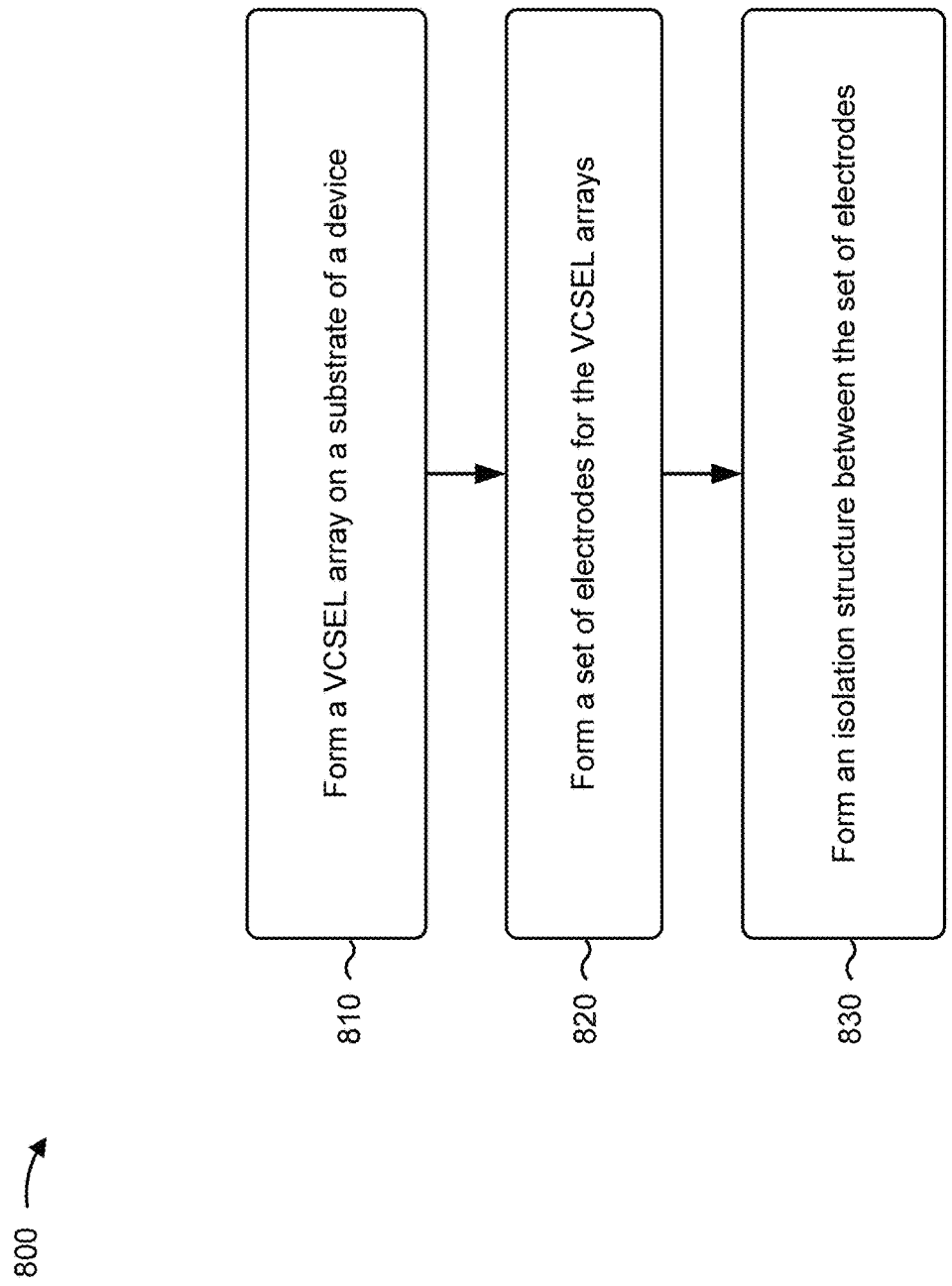
FIG. 8 is a flow chart of an example process for electrically isolating a VCSEL array.

FIG. 8 is a flow chart of an example process 800 for electrically isolating a VCSEL array. For example, FIG. 8 shows an example process for electrically isolating a VCSEL array (e.g., VCSEL arrays 302, VCSEL array 402, and/or the like) using an isolation structure (e.g., isolation structure 326, isolation structure 426, and/or the like).

As shown in FIG. 8, process 800 may include forming a VCSEL array on a substrate of a device (block 810). For example, process 800 may include forming a VCSEL array (e.g., VCSEL array 302, VCSEL array 402, and/or the like) on a substrate (e.g., substrate 306, substrate 406, and/or the like) of a device (e.g., device 300, device 400, and/or the like), as described above. In some implementations, the substrate may include a GaAs substrate, an InGaAs substrate, an InP substrate, and/or the like that has been n or p doped. Additionally, or alternatively, the substrate may be electrically conductive, may be semi-conductive, may have low electrical resistivity, and/or the like. In some implementations, the VCSEL array may include a plurality of VCSELs (e.g., VCSELs 304, VCSELs 404, and/or the like) vertical LEDs, a vertical-emitting lasers, and/or other types of vertical light emitting devices. In some implementations, one or more doped epitaxial layers (e.g., p-doped epitaxial layers 310, p-doped epitaxial layers 410, n-doped epitaxial layers 308, n-doped epitaxial layers 408, and/or the like) may be formed on the substrate. In some implementations, sets of epitaxial layers may be formed on the substrate to form the VCSEL array.

As further shown in FIG. 8, process 800 may include forming a set of electrodes for the VCSEL array (block 820).

For example, process 800 may include forming a bottom anode (e.g., bottom anode 318, bottom anode 418, and/or the like) and a bottom cathode (e.g., bottom cathode 320, bottom cathode 420, and/or the like) for each of the VCSEL arrays. In some implementations, forming the respective sets of electrodes may include forming a backside or bottom side via (e.g., via 324, via 424, and/or the like) in the substrate and one or more epitaxial layers so the anode of the VCSEL array may be brought down to the backside or bottom side of the substrate. In some implementations, forming the set of electrodes may include depositing a metallization layer or conductive plating on the backside or bottom side of the substrate for the bottom cathode, and depositing a metallization layer or conductive plating on the top of the substrate or the one or more epitaxial layers, on the sidewalls of the via, and on the bottom side or backside of the substrate for the top anode.

As further shown in FIG. 8, process 800 may include forming an isolation structure between the set of electrodes (block 830). For example, process 800 may include forming an isolation structure (e.g., isolation structure 326, isolation structure 426, and/or the like) between the set of electrodes, as described above. In some implementations, the isolation structure may include a trench that at least partially or fully encircles a via array included in the device and associated with the VCSEL array. In some implementations, the isolation structure may include a trench that extends from one side or edge of the device to another side or edge of the device.

In some implementations, forming the isolation structure may include etching from a backside or bottom side of the substrate, through the substrate, and through the one or more epitaxial layers to provide horizontal or lateral electrical isolation between the electrodes (e.g., the bottom cathode and the bottom anode) of the VCSEL array. In some implementations, forming the isolation structure may include etching through the one or more epitaxial layers and at least partially into or fully through the substrate from a top side of the substrate to provide horizontal or lateral electrical isolation between the electrodes (e.g., the bottom cathode and the bottom anode) of the VCSEL array. In some implementations, if the isolation structure includes a topside trench that is etched through the one or more epitaxial layers and at least partially into the substrate from a top side of the substrate, a remaining portion of the substrate between the bottom of the topside trench and the bottom side of the substrate may be processed to form an ion implant region or other non-conductive region to prevent lateral conduction in the remaining portion of the substrate. In some implementations, if the isolation structure includes a topside trench that is etched through the one or more epitaxial layers and at least partially into the substrate from a top side of the substrate, a mechanical support structure may be included in one or more portions of the topside trench to prevent separation between VCSEL arrays and/or other regions of the device. The mechanical support structure may include a zigzag region and/or another type of feature (sawtooth, stepped, castellated, and/or the like) in one or more portions of the topside trench.

In some implementations, forming the isolation structure may include at least partially or fully filling the isolation structure with various non-conductive materials, such as a polymer, a polyamide, a BCB polymer, and/or another type of dielectric material to increase electrical isolation and/or to provide mechanical support for the device. In some implementations, the isolation structure may include a mechanical support structure (e.g., mechanical support structure 628) to provide increased mechanical support for the device.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations described herein relate to VCSELs, VCSEL chips, VCSEL arrays, emitters, isolation structures such as backside trenches (e.g., encircling trenches and/or non-encircling trenches), backside vias, and/or the like. In some implementations, the VCSELs, VCSEL chips, VCSEL arrays, emitters, backside trenches, backside vias, and/or the like described herein may be used for three-dimensional sensing applications.

The number, arrangement, thicknesses, order, symmetry, and/or the like, of layers shown in the figures and/or described herein are provided as examples. In practice, emitter arrays and/or vertical-emitting devices shown in the figures and/or described herein may include additional layers, fewer layers, different layers, differently constructed layers, or differently arranged layers than those shown in the figures and/or described herein. Additionally, or alternatively, a set layers (e.g., one or more layers) of an emitter array and/or a vertical-emitting device may perform one or more functions described as being performed by another set of layers of the emitter array and/or the vertical-emitting device.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
  a substrate;
  a first vertical cavity surface emitting laser (VCSEL) array on the substrate;
  a second VCSEL array on the substrate and adjacent to the first VCSEL array;
  an isolation structure between the first VCSEL array and the second VCSEL array,
    wherein the isolation structure provides electrical isolation between the first VCSEL array and the second VCSEL array; and
  a backside via, etched from a bottom side of the substrate, to electrically connect a cathode of a first VCSEL included in the first VCSEL array with an anode of a second VCSEL included in the second VCSEL array,
    wherein the cathode of the first VCSEL is on the bottom side of the substrate, and
    wherein the anode of the second VCSEL is on a top side of the substrate.

2. The device of claim 1, wherein the isolation structure comprises:
  a trench that is at least partially filled with a non-conductive material.

3. The device of claim 2, wherein the trench encircles the first VCSEL array.

4. The device of claim 2, wherein the trench extends from a common first edge of the first VCSEL array and the second VCSEL array to a second common edge of the first VCSEL array and the second VCSEL array.

5. The device of claim 2, wherein the trench includes a mechanical support structure to provide mechanical support to the first VCSEL array.

6. The device of claim 1, wherein the isolation structure is etched from the bottom side of the substrate or from the top side of the substrate.

7. A device, comprising:
  a substrate;
  a plurality of vertical cavity surface emitting lasers (VCSELs) on the substrate;
  a backside via, etched from a bottom side of the substrate, to electrically connect a cathode of a first VCSEL, of the plurality of VCSELs, with an anode of a second VCSEL of the plurality of VCSELs,
    wherein the cathode of the first VCSEL is on the bottom side of the substrate, and
    wherein the anode of the second VCSEL is on a top side of the substrate; and
  an isolation structure,
    wherein the isolation structure provides electrical isolation for the first VCSEL.

8. The device of claim 7, wherein the isolation structure comprises a trench.

9. The device of claim 8, wherein the backside via is included in a via array associated with the plurality of VCSELs; and
  wherein the trench encircles the via array.

10. The device of claim 8, wherein the trench extends from a first edge of the device to a second edge of the device.

11. The device of claim 10, wherein the electrical isolation is completed when the device is separated from a wafer.

12. The device of claim 8, wherein the trench is at least partially filled with a non-conductive material; and
  wherein the non-conductive material comprises a polymer.

13. The device of claim 8, wherein the trench is etched from the bottom side of the substrate or from the top side of the substrate.

14. A device, comprising:
  a substrate;
  a first vertical cavity surface emitting laser (VCSEL) array on the substrate;
  a second VCSEL array on the substrate and adjacent to the first VCSEL array;

a backside via, etched from a bottom side of the substrate, to electrically connect a cathode of a first VCSEL of the first VCSEL array to an anode of a second VCSEL of the second VCSEL array,
  wherein the cathode of the first VCSEL is on the bottom side of the substrate, and
  wherein the anode of the second VCSEL is on a top side of the substrate; and
an isolation structure between the first VCSEL array and the second VCSEL array,
  wherein the isolation structure provides electrical isolation between the first VCSEL and the second VCSEL.

15. The device of claim 14, wherein the isolation structure comprises:
  a trench that is at least partially filled with at least one of:
    polyamide, or
    a benzocyclobutene polymer.

16. The device of claim 14, wherein the anode of the second VCSEL is above one or more epitaxial layers on the substrate.

17. The device of claim 14, wherein the isolation structure comprises:
  a trench that is at least partially filled with a non-conductive material,
    wherein the trench encircles the first VCSEL array, and
    wherein the trench is etched from the bottom side of the substrate or the top side of the substrate.

18. The device of claim 17, wherein the trench includes a plurality of mechanical support structures to provide mechanical support to the first VCSEL array,
  wherein each mechanical support structure, of the plurality of mechanical support structures, is located on a respective side of the first VCSEL array.

19. The device of claim 2, wherein the backside via is included in a via array associated with the first VCSEL array; and
  wherein the trench encircles the via array.

20. The device of claim 8, wherein the trench provides the electrical isolation between the first VCSEL and the second VCSEL, and
  wherein the trench is etched from the bottom side of the substrate or the top side of the substrate.

* * * * *